(12) United States Patent
Bae et al.

(10) Patent No.: US 11,018,107 B2
(45) Date of Patent: May 25, 2021

(54) SEMICONDUCTOR DEVICE

(71) Applicant: Amkor Technology Singapore Holding Pte. Ltd., Valley Point (SG)

(72) Inventors: Jae Hun Bae, Seoul (KR); Won Chul Do, Gyeonggi-do (KR); Min Yoo, Seoul (KR); Young Rae Kim, Gyeonggi-do (KR); Min Hwa Chang, Seoul (KR); Dong Hyun Kim, Jeju-si (KR); Ah Ra Jo, Gyeonggi-do (KR); Seok Geun Ahn, Gyeonggi-do (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 16/416,756

(22) Filed: May 20, 2019

(65) Prior Publication Data

US 2020/0051944 A1 Feb. 13, 2020

Related U.S. Application Data

(63) Continuation of application No. 15/847,329, filed on Dec. 19, 2017, now Pat. No. 10,340,244.

(30) Foreign Application Priority Data

Jan. 23, 2017 (KR) .......................... 10-2017-0010704

(51) Int. Cl.
*H01L 23/31* (2006.01)
*H01L 23/00* (2006.01)
(Continued)

(52) U.S. Cl.
CPC .......... *H01L 24/20* (2013.01); *H01L 21/6835* (2013.01); *H01L 23/49816* (2013.01); *H01L 23/5383* (2013.01); *H01L 24/14* (2013.01); *H01L 24/17* (2013.01); *H01L 24/19* (2013.01); *H01L 25/0655* (2013.01); *H01L 25/0657* (2013.01); *H01L 25/50* (2013.01); *H01L 23/3128* (2013.01); *H01L 23/538* (2013.01); *H01L 23/5385* (2013.01);
(Continued)

(58) Field of Classification Search
None
See application file for complete search history.

(56) References Cited

U.S. PATENT DOCUMENTS 6,656,827 B1 12/2003 Tsao et al.
7,402,901 B2 * 7/2008 Hatano ............... H01L 23/5389
257/684

(Continued)

*Primary Examiner* — Dung A. Le
(74) *Attorney, Agent, or Firm* — McAndrews, Held & Malloy, Ltd.

(57) ABSTRACT

A semiconductor device includes a low-density substrate, a high-density patch positioned inside a cavity in the low-density substrate, a first semiconductor die, and a second semiconductor die. The first semiconductor dies includes high-density bumps and low-density bumps. The second semiconductor die includes high-density bumps and low-density bumps. The high-density bumps of the first semiconductor die and the high-density bumps of the second semiconductor die are electrically connected to the high-density patch. The low-density bumps of the first semiconductor die and the low-density bumps of the second semiconductor die are electrically connected to the low-density substrate.

22 Claims, 6 Drawing Sheets

(51) Int. Cl.
   *H01L 23/498*   (2006.01)
   *H01L 25/065*   (2006.01)
   *H01L 25/00*    (2006.01)
   *H01L 23/538*   (2006.01)
   *H01L 21/683*   (2006.01)

(52) U.S. Cl.
   CPC .............. *H01L 24/13* (2013.01); *H01L 24/16* (2013.01); *H01L 24/81* (2013.01); *H01L 2221/68345* (2013.01); *H01L 2221/68381* (2013.01); *H01L 2224/13082* (2013.01); *H01L 2224/13101* (2013.01); *H01L 2224/13147* (2013.01); *H01L 2224/1403* (2013.01); *H01L 2224/16227* (2013.01); *H01L 2224/16235* (2013.01); *H01L 2224/32225* (2013.01); *H01L 2224/73204* (2013.01); *H01L 2224/81005* (2013.01); *H01L 2224/81203* (2013.01); *H01L 2224/81815* (2013.01); *H01L 2224/92125* (2013.01); *H01L 2924/15311* (2013.01)

(56) References Cited

U.S. PATENT DOCUMENTS

| | | |
|---|---|---|
| 8,546,955 B1 | 10/2013 | Wu |
| 9,026,872 B2 | 5/2015 | Camarota |
| 9,349,703 B2 | 5/2016 | Chiu |
| 9,653,428 B1 | 5/2017 | Hiner et al. |
| 10,163,833 B2 * | 12/2018 | Wang ................ H01L 25/0657 |
| 10,199,319 B2 * | 2/2019 | Shim ................. H01L 23/5383 |
| 10,361,170 B2 * | 7/2019 | Pyo .......................... H01L 25/50 |
| 2011/0044015 A1 | 2/2011 | Koide et al. |
| 2013/0063843 A1 | 3/2013 | Chen |
| 2013/0168854 A1 | 7/2013 | Karikalan |
| 2013/0168860 A1 | 7/2013 | Karikalan et al. |
| 2013/0207261 A1 | 8/2013 | Thacker |
| 2015/0116965 A1 | 4/2015 | Kim et al. |
| 2015/0155256 A1 | 6/2015 | Lin et al. |
| 2015/0184406 A1 * | 7/2015 | Naylor ................ E04G 23/0203 52/514 |
| 2015/0194406 A1 | 7/2015 | Teh |
| 2015/0318262 A1 | 11/2015 | Gu et al. |
| 2016/0056055 A1 | 2/2016 | Ko |
| 2016/0126161 A1 | 5/2016 | Fang |
| 2016/0240497 A1 | 8/2016 | Chen |
| 2016/0307870 A1 | 10/2016 | Kelly et al. |
| 2017/0309596 A1 | 10/2017 | Yu |
| 2018/0005987 A1 | 1/2018 | Hiner et al. |

\* cited by examiner

SEMICONDUCTOR DEVICE

CROSS-REFERENCE TO RELATED APPLICATION

This application is a continuation of U.S. patent application Ser. No. 15/847,329, filed Dec. 19, 2017, and titled "Semiconductor Device and Manufacturing Method Thereof"; which claims priority from Korean Patent Application No. 10-2017-0010704 filed on Jan. 23, 2017 in the Korean Intellectual Property Office, and all the benefits accruing therefrom under 35 U.S.C. 119; the entire contents of each of which are hereby incorporated herein by reference.

TECHNICAL FIELD

Various embodiments of the present disclosure relate to a semiconductor device and a manufacturing method thereof.

BACKGROUND

Semiconductor packaging protects integrated circuits, or chips, from physical damage and external stresses. In addition, semiconductor packaging can provide a thermal conductance path to efficiently remove heat generated in a chip, and also provide electrical connections to other components such as printed circuit boards, for example.

Limitations and disadvantages of conventional and traditional approaches should become apparent to one of skill in the art, through comparison of such systems with aspects of the present disclosure as set forth in the remainder of the present application.

DETAILED DESCRIPTION

Figure 1A:
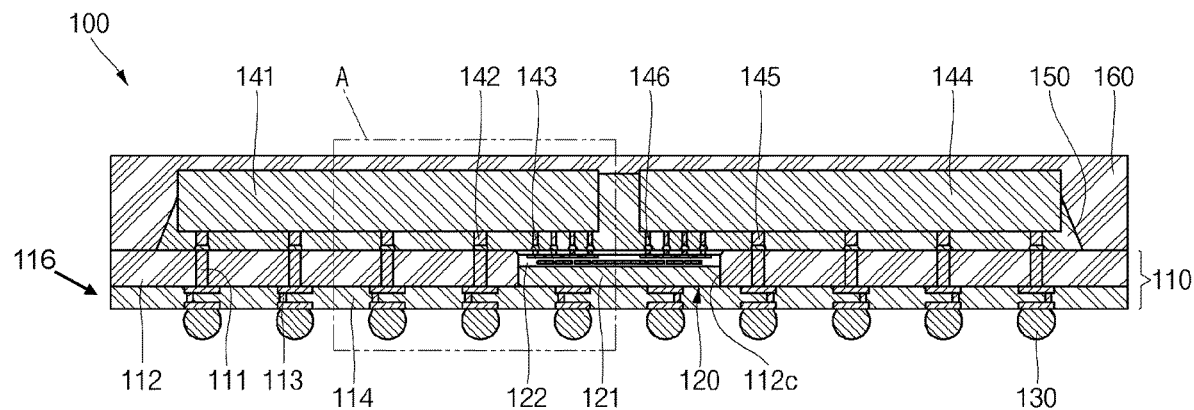
FIGS. 1A and 1B show a cross-sectional view and a partly enlarged cross-sectional view illustrating a semiconductor device according to various embodiments of the present disclosure.

Hereinafter, preferred example embodiments are described in detail with reference to the accompanying drawings. Various aspects of the present disclosure can be embodied in many different forms and should not be construed as being limited to the example embodiments set forth herein. Rather, these example embodiments of the disclosure are provided so that this disclosure will be thorough and complete and will convey various aspects of the disclosure to those skilled in the art.

In the drawings, the thickness of layers and regions may be exaggerated for clarity. Here, like reference numerals refer to like elements throughout. As used herein, the term "and/or" includes any and all combinations of one or more of the associated listed items. It will also be understood that when an element A is referred to as being "connected to" an element B, the element A can be directly connected to the element B or an intervening element C can be present and the element A and the element B are indirectly connected to each other.

The terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprise, include" and/or "comprising, including," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein can be interpreted accordingly.

Furthermore, the term "coplanar" and similar terms are used herein to denote two surfaces that lie within the same plane. Coplanar surfaces can be adjacent or adjoining each other; however non-adjacent and/or non-adjoining surfaces can also be coplanar. For example, a gap, a void, and/or other structures may be interposed between the coplanar surfaces. Furthermore, due to manufacturing tolerances, thermal expansion, and the like, slight deviations can exist in coplanar surfaces. Such deviations can result in one surface being slightly higher than the other surface, thus forming a step-off (e.g., a step-up or step-down) between surfaces. As used herein, the term "coplanar" includes surfaces having a step-off ranging between 0 and 7 microns.

Throughout the specification, expressions "high-density" and "low-density" are often used. The term "high-density" is used to mean a finer routing pitch than "low-density" or a finer routing pitch in a predetermined area of component than "low-density." The term "low-density" is used to mean a larger routing pitch than "high-density" or a coarser routing pitch in a predetermined area than "high-density." Thus, the terms "high-density" and "low density" are used as a shorthand to reflect a first area (i.e., a high-density area) having a higher number of routing lines or other noted structures than a second area (i.e., a low-density area), and thus a higher density of such routing lines or other structures. Structures in a high-density area can be finer (i.e., smaller or narrower) and/or can be positioned closer together (i.e., smaller separation between structures) with respect to similar structures of a low density area. Thus, the terms "high-density" and "low-density" specify a relationship that is internally definite and consistent with respect to areas or structures of a particular semiconductor device, but are not intended to connote a level of density of such areas or structures with respect to similar areas or structures of other semiconductor devices.

According to various embodiments of the present disclosure, the semiconductor device can include a low-density substrate, a high-density patch attached to the low-density substrate, a first semiconductor die including high-density bumps and low-density bumps, and a second semiconductor die including high-density bumps and low-density bumps. The high-density bumps of the first semiconductor die and the high-density bumps of the second semiconductor die can be electrically connected to the high-density patch. The low-density bumps of the first semiconductor die and the low-density bumps of the second semiconductor die can be electrically connected to the low-density substrate.

The high-density patch can include a high-density redistribution structure having high-density circuit patterns. The low-density substrate can include a low-density redistribution structure having low-density circuit patterns. The high-density circuit patterns can be electrically connected to the high-density bumps. The low-density circuit patterns can be electrically connected to the low-density bumps.

The high-density patch can further include high-density pads interposed between the high-density circuit patterns and the high-density bumps. The high-density pads can be surrounded by an underfill.

The low-density substrate can include a first dielectric layer, low-density pillars through the first dielectric layer, and a low-density redistribution structure under the first dielectric layer and the low-density pillars. The low-density pillars can be interposed between the low-density bumps of the first and second die and low-density circuit patterns of the low-density redistribution structure. Top surfaces of the high-density pads and top surfaces of the low-density pillars can be coplanar. Moreover, the top surfaces of the high-density pads, the top surfaces the low-density pillars, and the top surface of the first dielectric layer can be coplanar.

The first and second dielectric layers can include resins. The first dielectric layer can include a larger amount of inorganic fillers than second dielectric layers of the low-density redistribution structure. The first dielectric layer can include an epoxy molding compound.

A bottom surface of the high-density patch can contact a top surface of the low-density redistribution structure. The high-density patch can be positioned inside a cavity in the first dielectric layer. Side surfaces of the high-density patch can contact side surfaces of the cavity in the first dielectric layer.

According to various embodiments of the present disclosure, the manufacturing method of a semiconductor device can include forming high-density pads and low-density pillars on a first carrier, electrically connecting a high-density patch to the high-density pads, and forming a low-density substrate with the low-density pillar embedded therein. The method can further include removing the first carrier to expose the high-density patch and the low-density pillars. The method can also include electrically connecting the first semiconductor die and the second semiconductor die to the exposed high-density patch and low-density pillars to electrically connect the first and second semiconductor dies to each other through the high-density patch.

The low-density substrate can be formed by covering the low-density pillars with a first dielectric layer and forming a low-density redistribution structure over the first dielectric layer to electrically connect low-density circuit patterns of the redistribution structure to the low-density pillars in the first dielectric layer.

The low-density redistribution layer can cover the high-density patch. Conductive bumps can be formed on the low-density substrate, and the first carrier can be removed after a second carrier is adhered to the low-density substrate by applying an adhesive to the conductive bumps.

The first semiconductor die can include high-density bumps and low-density bumps, the second semiconductor die can include high-density bumps and low-density bumps, and the high-density bumps of the first semiconductor die and the high-density bumps of the second semiconductor die can be electrically connected to the high-density patch. The low-density bumps of the first semiconductor die and the low-density bumps of the second semiconductor die can be electrically connected to the low-density substrate.

As described above, according to various embodiments of the present disclosure, the high-density bumps of the first semiconductor die and the high-density bumps of second semiconductor die can be electrically connected to each other via the high-density patch. Moreover, the low-density bumps of the first semiconductor die and the low-density bumps of the second semiconductor die can be electrically connected to the low-density substrate, thereby allowing the high-density bumps of the first and second semiconductor dies to be easily electrically connected to each other by the high-density patch having a high routing density without increasing the routing density of the low-density substrate.

Furthermore, in various embodiments of the present disclosure, the high-density patch after undergoing routing tests can be electrically connected to regions corresponding to the high-density bumps of the first and second semiconductor dies. Such prior testing and later interconnection can improve reliability in electrical connections of the first and second semiconductor dies and reduce semiconductor packaging costs.

Figure 1B:
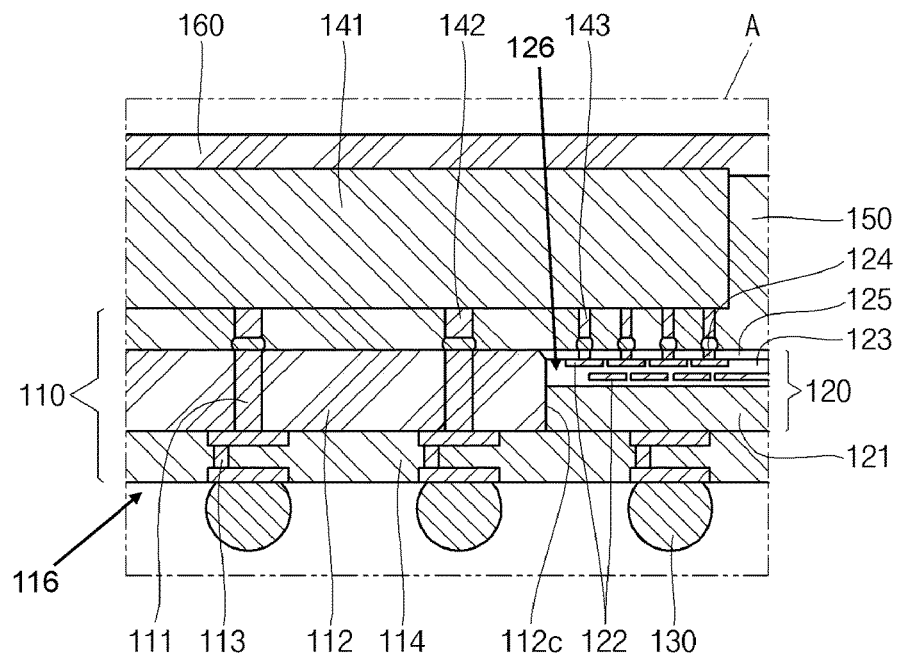

Referring to FIGS. 1A and 1B, a cross-sectional view and a partly enlarged cross-sectional view illustrating a semiconductor device 100 according to various embodiments of the present disclosure are illustrated. As illustrated in FIGS. 1A and 1B, the semiconductor device 100 can include a low-density substrate 110 and a high-density patch 120. In addition, the semiconductor device 100 can further include conductive bumps 130 attached to the low-density substrate 110. The semiconductor device 100 can further include a first semiconductor die 141 and/or a second semiconductor die 144. The semiconductor device 100 can also include an encapsulant 160 encapsulating the first semiconductor die 141 and/or the second semiconductor die 144.

The low-density substrate 110 can include a plurality of low-density pillars 111 and a first dielectric layer 112. The plurality of low-density pillars 111 can be horizontally arranged such that the plurality of low-density pillars are spaced a predetermined distance apart from each other. The plurality of low-density pillars can be encompassed by the first dielectric layer 112. In particular, the plurality of low-density pillars 111 can be configured to substantially vertically penetrate the first dielectric layer 112, and the first dielectric layer 112 can be configured to have a planar top surface and a planar bottom surface. In other words, top surfaces of the low-density pillars 111 can be coplanar with the top surface of the first dielectric layer 112 and bottom surfaces of the low-density pillars 111 can be coplanar with a bottom surface of the first dielectric layer 112. In addition, the first dielectric layer 112 can further include a cavity 112c having a predetermined depth and width sufficient to receive the high-density patch 120. In some embodiments, the cavity 112c can be positioned roughly at the center of the first dielectric layer 112.

The low-density pillars 111 can comprise copper pillars or copper posts formed by a general copper plating process. The first dielectric layer 112 can comprise an epoxy molding compound or an epoxy molding resin used in a general molding or encapsulating process. In some embodiments, the first dielectric layer 112 can include a relatively large amount of inorganic fillers to obtain a relatively high hardness. Therefore, the first dielectric layer 112 can serve as a core of the low-density substrate 110. The low-density pillars 111 can comprise gold, silver, nickel, palladium, and any other suitable alloys of these elements, in addition to copper.

In addition, the low-density substrate 110 can include a low-density redistribution structure 116. The low-density redistribution structure can include one or more low-density circuit patterns 113 and one or more second dielectric layers 114. The low-density circuit patterns 113 can be horizontally arranged such that the plurality of low-density patterns 113 are spaced a predetermined distance apart from each other.

Specifically, one or more low-density circuit patterns 113 can be configured to substantially vertically penetrate the one or more second dielectric layers 114. The one or more second dielectric layers 114 can be configured to provide a planar top surface and a planar bottom surface of the low-density redistribution structure 116. In particular, top surfaces of a top-most, low-density circuit pattern 113 of the one or more low-density circuit patterns 113 can be coplanar with the top surface of a top-most, second dielectric layer 114 of the one or more second dielectric layer. Similarly, bottom surfaces of a bottom-most, low-density circuit pattern 113 of the one or more low-density circuit patterns 113 can be coplanar with the bottom surface of a bottom-most, second dielectric layer 114 of the one or more dielectric layers 114.

The one or more low-density circuit patterns 113 and the one or more second dielectric layers 114 can be configured to block a bottom portion of the cavity 112c. To this end, the one or more low-density circuit patterns 113 and the one or more second dielectric layers 114 of the low-density redistribution structure 116 can be formed by a general coreless build-up process. In particular, the one or more low-density circuit patterns 113 and the one or more second dielectric layers 114 can provide a multi-layered structure or a laminating structure of the low-density redistribution layer 116. A second dielectric layer 114 can lie between an overlying low-density circuit pattern 113 and an underlying low-density circuit pattern 113. Conductive vias, through the intervening second dielectric layer 114, can electrically connect the overlying low-density circuit pattern 113 to the underlying low-density circuit pattern 113.

In some embodiments, the low-density circuit patterns 113 can include copper circuit patterns or traces formed by a general copper plating process. In other embodiments, the low-density circuit patterns 113 can include gold, silver, nickel, palladium, and any other suitable alloys of these elements, in addition to copper.

The low-density pillars 111 can be electrically connected to the low-density circuit patterns 113. Moreover, the first dielectric layer 112 and the low-density redistribution structure 116 can be adhered to each other.

The second dielectric layers 114 can include polyimide (PI), benzocyclobutane (BCB), polybenzo oxazole (PBO), bismaleimide triazine (BT), phenol resin or epoxy resin. In some embodiments, the second dielectric layers 114 can include no inorganic fillers or a smaller amount of inorganic fillers than the first dielectric layer 112. Such differences in inorganic filler content can impart the second dielectric layers 114 with a lower hardness than the first dielectric layer 112. The lower hardness or softness of the second dielectric layers 114 can aid in preventing cracks from occurring to the conductive bumps 130 described below.

Meanwhile, lines/spaces/widths of the low-density pillars 111 and the low-density circuit patterns 113 (including conductive vias) can range from about 40 µm to about 100 µm.

The high-density patch 120 can be attached to the low-density substrate 110. In an example embodiment, the high-density patch 120 can be positioned in a cavity 112c provided in the low-density substrate 110. The high-density patch 120 can have a thickness substantially equal to or similar to a depth of the cavity 112c. Therefore, the high-density patch 120 can be securely mounted on the low-density substrate 110 such that the thickness of the low-density substrate 110 and/or the thickness of the semiconductor device 100 is not increased to accommodate the high-density patch 120.

In addition, the high-density patch 120 can be attached to the low-density redistribution structure 116 while being coupled to the cavity 112c of the first dielectric layer 112. In other words, the bottom surface of the high-density patch 120 can contact a top surface of the low-density redistribution structure 116. Side surfaces of the high-density patch 120 can contact side surfaces of the cavity 112c provided in the first dielectric layer 112.

The high-density patch 120 can include a base plate 121 and a high-density redistribution structure 126 on the base plate 121. In an example embodiment, the base plate 121 can include silicon glass or ceramic. A bottom surface of the base plate 121 can be substantially attached to the top surface of the low-density redistribution structure 116.

In some embodiments, the high-density redistribution structure 126 may provide a multi-layer structure of one or more high-density circuit patterns 122, and one or more dielectric layers 123. The one or more high-density circuit patterns 122 can include one or more copper circuit patterns or traces formed by a general copper plating process. In other embodiments, the one or more high-density circuit patterns 122 can include gold, silver, nickel, palladium, and any other suitable alloys of these elements, in addition to copper.

In some embodiments, the one or more dielectric layers 123 can include polyimide (PI), benzocyclobutane (BCB), polybenzo oxazole (PBO), bismaleimide triazine (BT), phenol resin or epoxy resin. In other embodiments, the one or more dielectric layers 123 can include $SiO_2$, $Si_3N_4$, $Al_2O_3$, $Ta_2O_5$, $TiO_2$, $ZrO_2$ or $HFO_2$, which have a high dielectric constant.

The one or more high-density circuit patterns 122 and the one or more dielectric layers 123 of the high-density redistribution structure 126 can be formed by a general coreless build-up process. In particular, the one or more high-density circuit patterns 122 and the one or more dielectric layers 123 can provide a multi-layered structure or a laminating structure of the high-density redistribution layer 126. A dielectric layer 123 can lie between an overlying high-density circuit pattern 122 and an underlying high-density circuit pattern 122. Conductive vias, through the intervening dielectric layer 123, can electrically connect the overlying high-density circuit pattern 122 to the underlying high-density circuit pattern 122.

The high-density patch 120 can further include high-density pads 124 electrically connected to the high-density circuit patterns 122. The high-density pads 124 can be formed by a general plating process of copper, gold, silver, nickel, palladium or any other suitable alloys of these elements. In addition, the high-density pads 124 can be covered by an underfill 125. Meanwhile, lines/spaces/widths of the high-density circuit patterns 122 and the high-density pads 124 can range from about 0.1 µm to about 40 µm. Accordingly, the high-density patch 120 can have a higher routing density than the low-density substrate 110.

In addition, the top surfaces of the low-density pillars 111 and the top surface of the high-density pads 124 can be coplanar. In particular, the top surfaces of the low-density pillars 111, the top surface of the first dielectric layer 112, and the top surface of the high-density pads 124 can be coplanar. In more detail, the top surfaces of the low-density pillars 111, the top surface of the first dielectric layer 112, the top surface of the high-density pads 124, and the top surface of the underfill 125 can be coplanar.

The conductive bumps 130 can be electrically connected to the low-density circuit patterns 113 that are exposed through the bottom surface of the low-density substrate 110. For example, the conductive bumps 130 can be formed from an eutectic solder (Sn37Pb), a high lead solder (Sn95Pb), and a lead-free solder (SnAg, SnAu, SnCu, SnZn, SnZnBi, SnAgCu, SnAgBi, and the like), and equivalents thereof. The conductive bumps 130, as illustrated in FIGS. 1A and 1B, can be shaped as spherical balls. Alternatively, although not illustrated, the conductive bumps 130 can be shaped as flattened lands.

In some embodiments, the first semiconductor die 141 and the second semiconductor die 144 have substantially the same or similar structure. As such, the first semiconductor die 141 and the second semiconductor die 144 are described together.

The first and second semiconductor dies 141 and 144 can be horizontally arranged and can be electrically connected to the low-density substrate 110 and the high-density patch 120. Although FIG. 1A illustrates two semiconductor dies 141 and 144 horizontally arranged around the high-density patch 120, three, four or possibly more semiconductor dies can be horizontally arranged around the high-density patch 120 when viewed from above. In such an embodiment, high-density bumps of the dies can be formed at a corner and/or an edge of each semiconductor die that is proximate the high-density patch 120. Such high-density bumps can connect respective semiconductor dies to the high-density patch 120 as described below.

The first and second semiconductor dies 141 and 144 can include a plurality of low-density bumps 142 and 145 and a plurality of high-density bumps 143 and 146, respectively. As shown, the low-density bumps 142 and 145 of the first and second semiconductor dies 141 and 144 can be formed at a region or regions that are distal from high-density patch 120, and the high-density bumps 143 and 146 of the first and second semiconductor dies 141 and 144 can be formed at a region that is proximate the high-density patch 120. As further illustrated, when the first and second semiconductor dies 141 and 144 are positioned such that their respective high-density bumps 143 and 146 are proximate to each other, the low-density bumps 142 and 145 of the first and second semiconductor dies 141 and 144 can be positioned distal from each other.

In one example embodiment, the low-density bumps 142 and 145 and the high-density bumps 143 and 146 can comprise copper pillars or copper posts having solder caps. In another example embodiment, the low-density bumps 142 and 145 can comprise solder bumps and the high-density bumps 143 and 146 can comprise copper pillars, which provide a finer pitch than the solder bumps. In still another example embodiment, the low-density bumps 142 and 145 and the high-density bumps 143 and 146 can comprise solder bumps.

Meanwhile, the low-density bumps 142 and 145 of the first and second semiconductor dies 141 and 144 can be electrically connected to the low-density circuit patterns 113 of the low-density substrate 110. In particular, the low-density bumps 142 and 145 can be electrically connected to the low-density circuit patterns 113 through the low-density pillars 111. Similarly, the high-density bumps 143 and 146 of the first and second semiconductor dies 141 and 144 can be electrically connected to the high-density circuit patterns 122 of the high-density patch 120. More specifically, the high-density bumps 143 and 146 can be electrically connected to the high-density circuit patterns 122 through the high-density pads 124.

Therefore, the low-density bumps 142 and 145 of the first and second semiconductor dies 141 and 144 can be respectively electrically connected to the low-density substrate 110. As such, the low-density bumps 142 and 145 can be electrically connected to the conductive bumps 130 provided on the bottom surface of the low-density substrate 110. Moreover, the high-density bumps 143 and 146 of the first and second semiconductor dies 141 and 144 can be electrically connected to each other through the high-density patch 120 without being electrically routed through the low-density substrate 110.

Here, the first and second semiconductor dies 141 and 144 can include integrated circuit dies separated from a semiconductor wafer, respectively, and can include, for example, electrical circuits, such as digital signal processors (DSPs), network processors, power management units, audio processors, RF circuits, wireless baseband system-on-chip (SOC) processors, sensors or application specific integrated circuits.

In some embodiments, the encapsulant 160 can completely encapsulate the first and second semiconductor dies 141 and 144 on the low-density substrate 110 to protect the first and second semiconductor dies 141 and 144 against external environments. In other embodiments, top surfaces of the first and second semiconductor dies 141 and 144 can remain exposed to the outside through the encapsulant 160 to improve heat radiating efficiency of the first and second semiconductor dies 141 and 144. In some embodiments, an underfill 150 can further fill gaps or spaces between the first and second semiconductor dies 141 and 144 and the low-density substrate 110. As such, the encapsulant 160 can cover not only the first and second semiconductor dies 141 and 144 but the underfill 150. The encapsulant 160 can comprise an epoxy molding compound, an epoxy molding resin, and equivalents thereof. In some embodiment, the encapsulant 160 can comprise a material that is the same as the material used to form the first dielectric layer 112.

Thus, according to various embodiments of the present disclosure, the semiconductor device 100 can comprise the low-density substrate 110 and the high-density patch 120. Specifically, in various embodiments of the present disclosure, the high-density bumps 143 of the first semiconductor die 141 and the high-density bumps 146 of the second semiconductor die 144 can be electrically connected to each other by the high-density patch 120. However, the low-density bumps 142 of the first semiconductor die 141 and the low-density bumps 145 of the second semiconductor die 144 can be electrically connected to the low-density substrate 110. Therefore, the high-density bumps 143 of the first and second semiconductor dies 141 and 144 can be electrically connected to each other by the high-density patch 120 having a high routing density without increasing the routing density of the low-density substrate 110.

Moreover, in various embodiments of the present disclosure, a high-density patch 120 can be electrically connected to regions corresponding to the high-density bumps 143 and 146 of the first and second semiconductor dies 141 and 144 only after successfully completing routing tests. In this manner, reliability in electrical connections of the first and second semiconductor dies 141 and 144 can be improved and semiconductor packaging costs can be reduced.

Figure 2A:
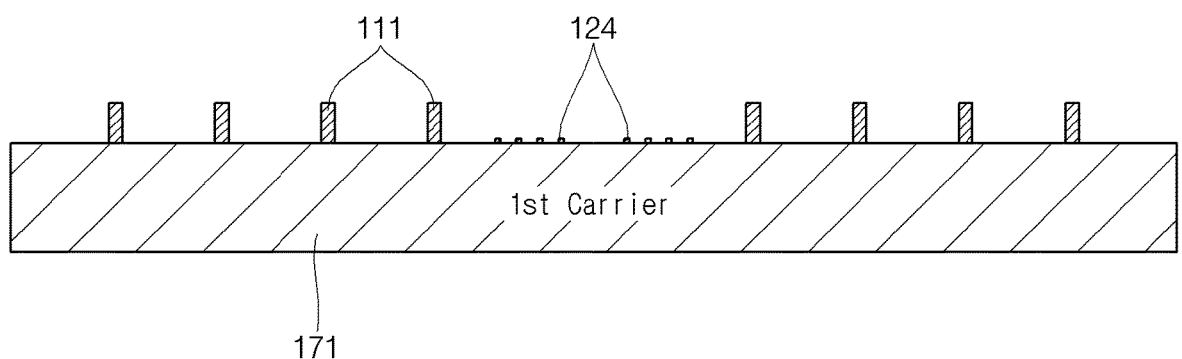
FIGS. 2A to 2J show cross-sectional views illustrating a manufacturing method of a semiconductor device according to various embodiments of the present disclosure.

Referring to FIGS. 2A to 2J, cross-sectional views are provided, which illustrate a manufacturing method of a semiconductor device according to various embodiments of the present disclosure. As illustrated in FIG. 2A, low-density pillars 111 and high-density pads 124 can be formed on a first carrier 171 having a planar top surface and a planar bottom surface. The first carrier 171 can include silicon, glass, or metal.

In an example embodiment, the low-density pillars 111 can be formed as a group about peripheral regions of the first carrier 171. Conversely, the high-density pads 124 can be formed as a group within a central region of the first carrier 171. Moreover, the low-density pillars 111 and the high-density pads can be formed such that the low-density pillars 111 have larger lines/spaces/widths than the high-density pads 124. As such, the low-density pillars 111 can be larger (e.g., greater widths) and/or have a greater pitch (e.g., greater separations between pillars) than the high-density pads 124, thus resulting in a density of pillars 111 (i.e., number of pillars 111 per unit area) in its respective region being lower than the density of pads 124 (i.e., number of pads 124 per unit area) in its respective region.

The low-density pillars 111 and/or the high-density pads 124 can be formed by electroplating, electroless plating, sputtering, physical vapor deposition (PVD), or chemical vapor deposition (CVD). In some embodiments, the low-density pillars 111 and the high-density pads 124 can be formed by electroplating at low costs.

Figure 2B:
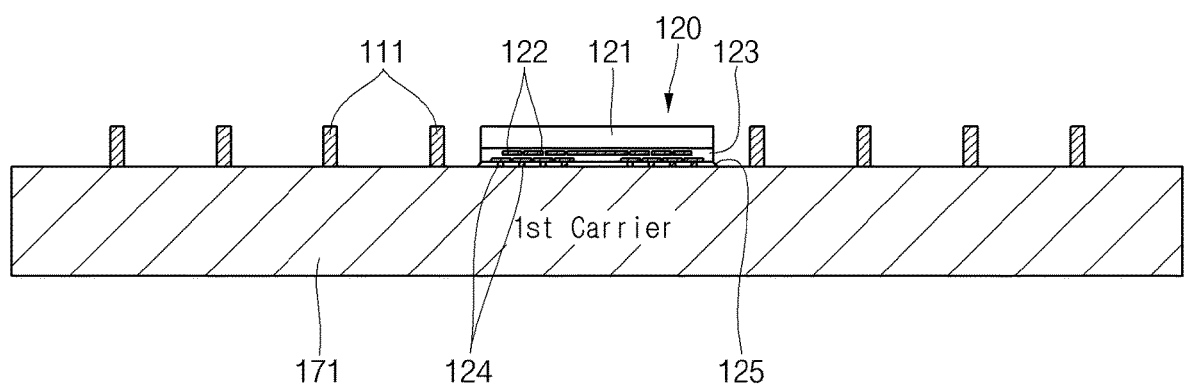

As illustrated in FIG. 2B, a high-density patch 120 can be electrically connected to the high-density pads 124. The high-density patch 120 can include a base plate 121, a dielectric layer 123, and high-density circuit patterns 122. In particular, the high-density circuit patterns 122 can be electrically connected to the high-density pads 124. In an example embodiment, the high-density circuit patterns 122 can be electrically connected to the high-density pads 124 by a thermo-compression bonding method. In another example embodiment, the high-density circuit patterns 122 can be electrically connected to the high-density pads 124 by a conductive paste, such as a solder, an anisotropically conductive film, or an anisotropically conductive paste. In addition, an underfill 125 can be applied to fill a gap between the high-density patch 120 and the first carrier 171, surround the high-density pads 124, and secure the high-density patch 120 to the first carrier 171.

Figure 2C:
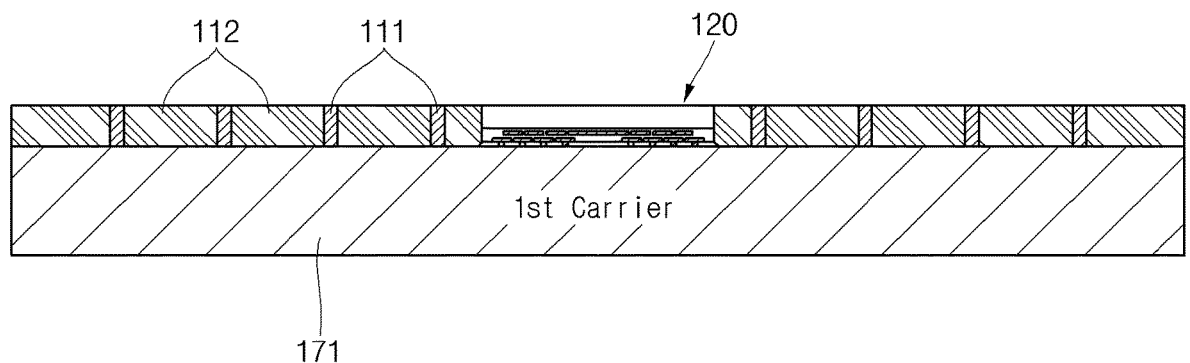

As illustrated in FIG. 2C, the low-density pillars 111 can be covered by a first dielectric layer 112. In an example embodiment, the first dielectric layer 112 can include an epoxy molding compound or an epoxy molding resin. Therefore, the low-density pillars 111 disposed on the first carrier 171 can be surrounded by the first dielectric layer 112 by general dispensing, molding, compression molding, or transfer molding. In particular, the first dielectric layer 112 can be formed to have a thickness sufficient to cover side surfaces and top surfaces of the low-density pillars 111 and side surfaces and top surfaces of the high-density patch 120. In such an embodiment, the top surface of the first dielectric layer 112 can be removed by mechanical grinding or chemical etching. In some embodiments, not only the top surface of the first dielectric layer 112 but also the top surface of the high-density patch 120 and top surfaces of the low-density pillars 111 can be subjected to grinding and/or etching. After such grinding or etching, the top surfaces of the low-density pillars 111, the top surface of the high-density patch 120 (e.g., the top surface of the base plate 121) can be coplanar with a top surface of a second dielectric layer 114.

Figure 2D:
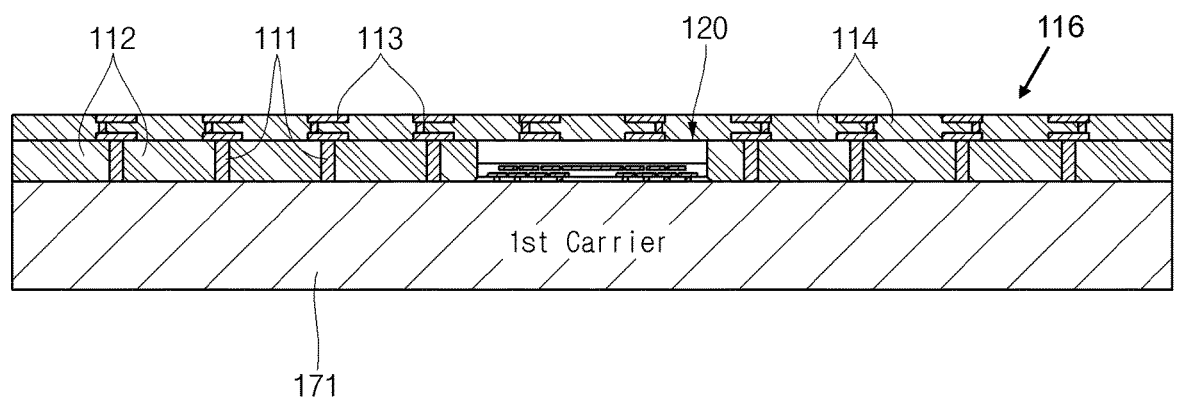

As illustrated in FIG. 2D, the low-density substrate 110 can be completed by forming a low-density redistribution structure 116 over the low-density pillars 111, the first dielectric layer 112, and the high-density patch 120. As shown, the low-density redistribution structure 116 can include one or more low-density circuit patterns 113 and one or more second dielectric layers 114. The one or more low-density circuit patterns 113 and the one or more second dielectric layers 114 can be formed on the low-density pillars 111, the first dielectric layer 112, and the high-density patch 120 by a general coreless build-up process. In particular, the one or more low-density circuit patterns 113 and the one or more second dielectric layers 114 can provide a multi-layered structure or a laminating structure of the low-density redistribution layer 116. A second dielectric layer 114 can lie between an overlying low-density circuit pattern 113 and an underlying low-density circuit pattern 113. Conductive vias, through the intervening second dielectric layer 114, can electrically connect the overlying low-density circuit pattern 113 to the underlying low-density circuit pattern 113.

As the result of the aforementioned process, the low-density redistribution structure 116 can be adhered to the first dielectric layer 112 and the low-density circuit patterns 113 of the low-density redistribution structure 116 can be electrically connected to the low-density pillars 111. The second dielectric layers 114 can be formed by general spin coating, printing, spray coating, sintering, thermal oxidation, physical vapor deposition (PVD), chemical vapor deposition (CVD), or atomic layer deposition (ALD). The low-density circuit patterns 113 can be formed by general electroplating, electroless plating, sputtering, physical vapor deposition (PVD), or chemical vapor deposition (CVD).

As described above, the top surfaces of the low-density pillars 111, the top surface of the first dielectric layer 112, and the top surface of the high-density patch 120 can be coplanar. Due to the formation upon such top surfaces, the top surface of the second dielectric layer 114 and the top surfaces of the low-density circuit patterns 113 can also be coplanar. Moreover, the top surfaces of the low-density circuit patterns 113 can be exposed to the outside through the top surface of the second dielectric layer 114.

Notably, the top surface of the high-density patch 120 can be covered by the low-density circuit patterns 113 and the second dielectric layer 114 of the low-density redistribution structure 116. In particular, the high-density patch 120 can be configured to be embedded in the low-density substrate 110 such that a thickness of the low-density substrate 110 is not substantially increased by the high-density patch 120.

Figure 2E:
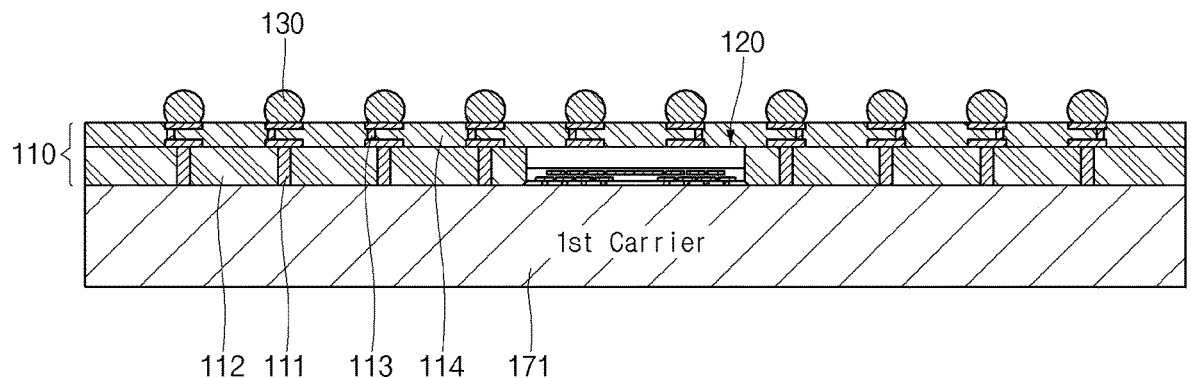

As illustrated in FIG. 2E, conductive bumps 130 can be formed on the top surface of the low-density redistribution structure 116 of the low-density substrate 110. In an example embodiment, the conductive bumps 130 can be electrically connected to the low-density circuit patterns 113 of the low-density substrate 110 by a general mass reflow process or a laser assist bonding process. In addition, the conductive bumps 130 can be shaped as spherical balls, as illustrated in FIG. 2E, or as flattened lands.

Figure 2F:
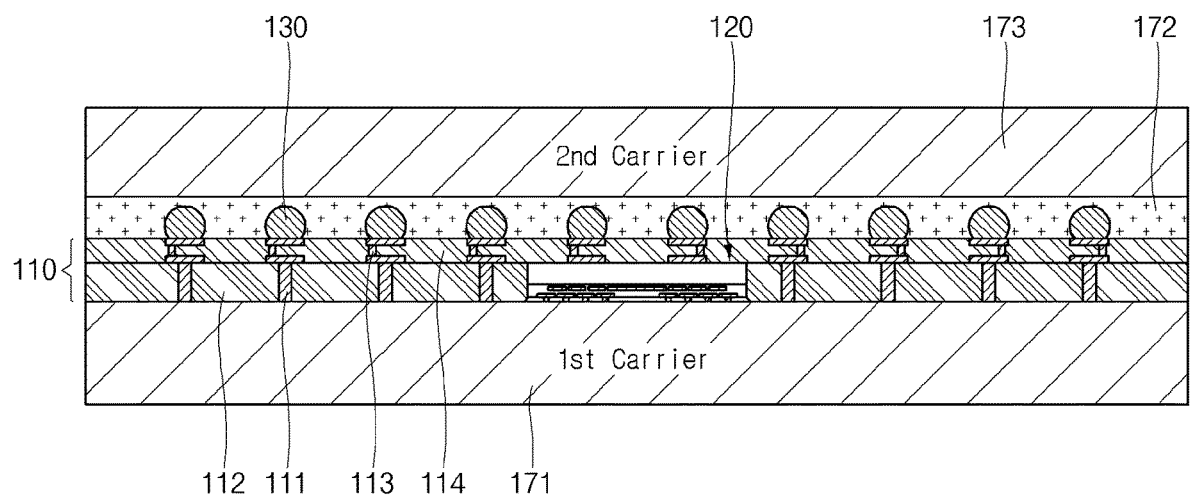

As illustrated in FIG. 2F, a second carrier 173 can be adhered to the low-density substrate 110 using a temporary adhesive 172. Specifically, the temporary adhesive 172 can be applied to the low-density substrate 110 while covering the conductive bumps 130. The second carrier 173 can be positioned on the temporary adhesive 172 to be adhered to the low-density substrate 110. The temporary adhesive 172 can comprise an adhesive, which loses its adhesiveness in the presence of heat, light, or a chemical solution. In addition, the second carrier 173 can comprise silicon, glass, ceramic, or metal.

Figure 2G:
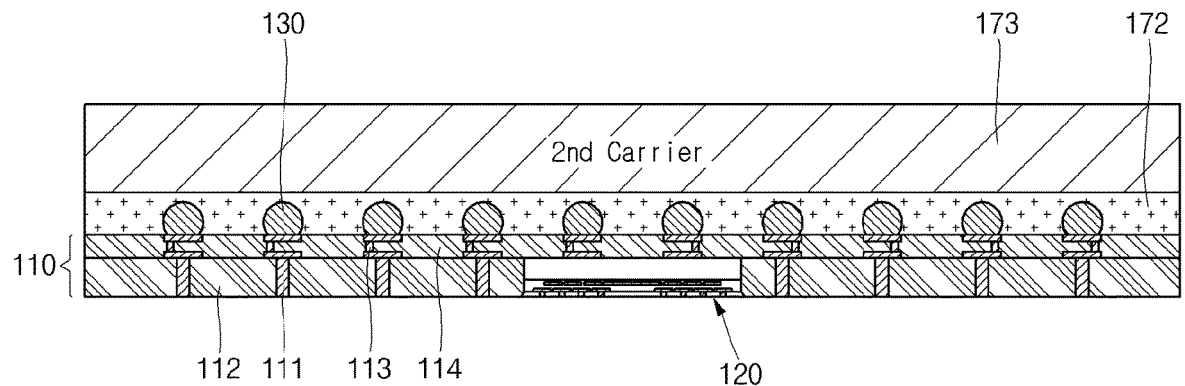

As illustrated in FIG. 2G, the first carrier 171 can be removed to expose a bottom surface of the low-density substrate 110 and a bottom surface of the high-density patch 120. In particular, the first carrier 171 can be removed by general mechanical grinding, chemical etching, or physical exfoliation. Accordingly, in the low-density substrate 110, bottom surfaces of the low-density pillars 111 and a bottom surface of the first dielectric layer 112 can be exposed to the outside. In addition, in the high-density patch 120, a bottom surface of the high-density pads 124 and a bottom surface of the underfill 125 can be exposed to the outside. The bottom surfaces of the low-density pillars 111, the bottom surface of the first dielectric layer 112, the bottom surface of the high-density pads 124 and/or the bottom surface of the underfill 125 can be coplanar.

Figure 2H:
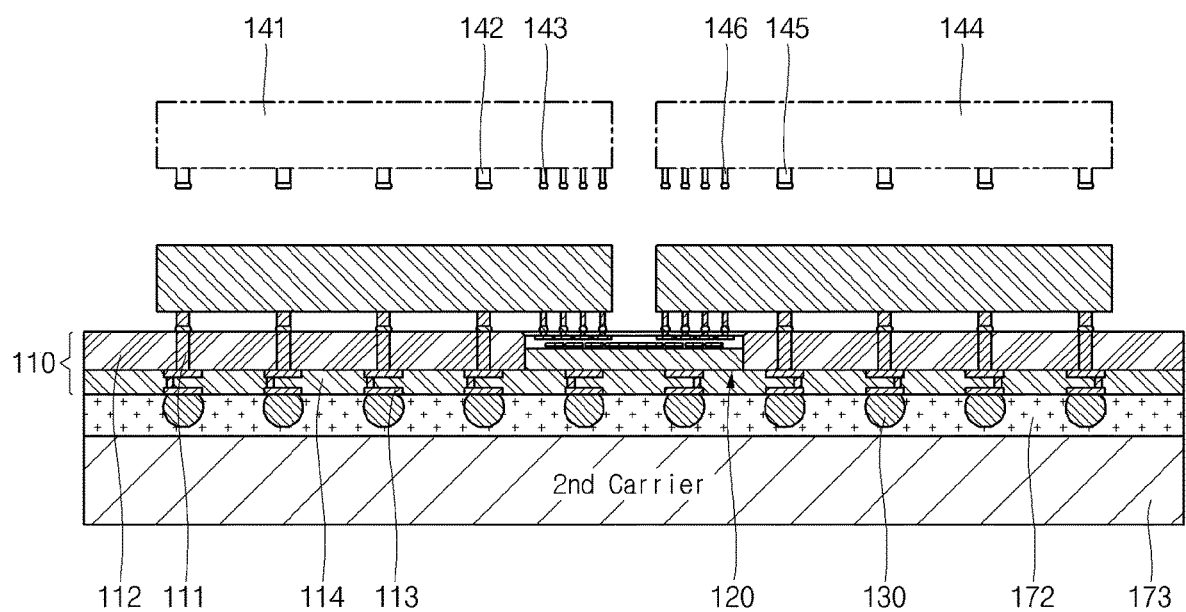

As illustrated in FIG. 2H, the first and second semiconductor dies 141 and 144 can be electrically connected to the low-density substrate 110 and the high-density patch 120. In particular, the first and second semiconductor dies 141 and 144 can respectively include low-density bumps 142 and 145 and high-density bumps 143 and 146. The low-density bumps 142 and 145 can be electrically connected to the low-density circuit patterns 113 of the low-density substrate 110, and the high-density bumps 143 and 146 can be electrically connected to the high-density circuit patterns 122 of the high-density patch 120. In particular, the low-density bumps 142 and 145 can be electrically connected to the low-density circuit patterns 113 through the low-density pillars 111. The high-density bumps 143 and 146 can be electrically connected to the high-density circuit patterns 122 through the high-density pads 124.

Since the top surfaces of the low-density pillars 111, the top surface of the first dielectric layer 112, the top surface of the high-density pads 124, and/or the top surface of the underfill 125 are all coplanar, heights or thicknesses of the low-density bumps 142 and 145 and the high-density bumps 143 and 146 can be all equal. Moreover, bottom surfaces of the low-density bumps 142 and 145 and bottom surfaces of the high-density bumps 143 and 146 can be coplanar. Thus, the low-density bumps 142 and 145 and the high-density bumps 143 and 146 can be substantially the same with one another in terms of height or thickness, except for differences in lines/spaces/widths between the low-density bumps 142 and 145 and the high-density bumps 143 and 146.

Such configuration can increase manageability of the first and second semiconductor dies 141 and 144. In particular, during a thermal compression process or a mass reflow process of the first and second semiconductor dies 141 and 144, the first and second semiconductor dies 141 and 144 can be securely positioned on the low-density substrate 110 and the high-density patch 124 temporarily for a predetermined time. After such positioning, the first and second semiconductor dies 141 and 144 can be electrically connected and affixed to the low-density substrate 110 and the high-density patch 120 by a general thermal compression bonding process or a mass reflow process.

Figure 2I:
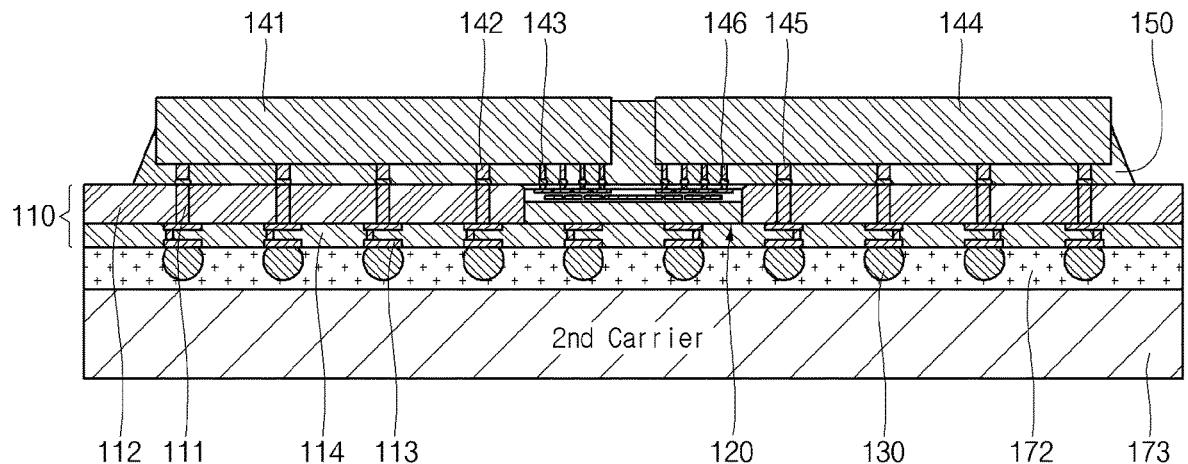

As illustrated in FIG. 2I, the underfill 150 can be applied to fill gaps between each of the first and second semiconductor dies 141 and 144, the low-density substrate 110, and the high-density patch 120. In particular, the underfill 150 can fill gaps or spaces between the first and second semiconductor dies 141 and 144 and the low-density substrate 110, between the first and second semiconductor dies 141 and 144 and the high-density patch 120, and between the first and second semiconductor dies 141 and 144. Such filling can mechanically couple the first and second semiconductor dies 141 and 144, the low-density substrate 110, and the high-density patch 120 to one another. In some embodiments, the process of applying the underfill 150 can be skipped.

Figure 2J:
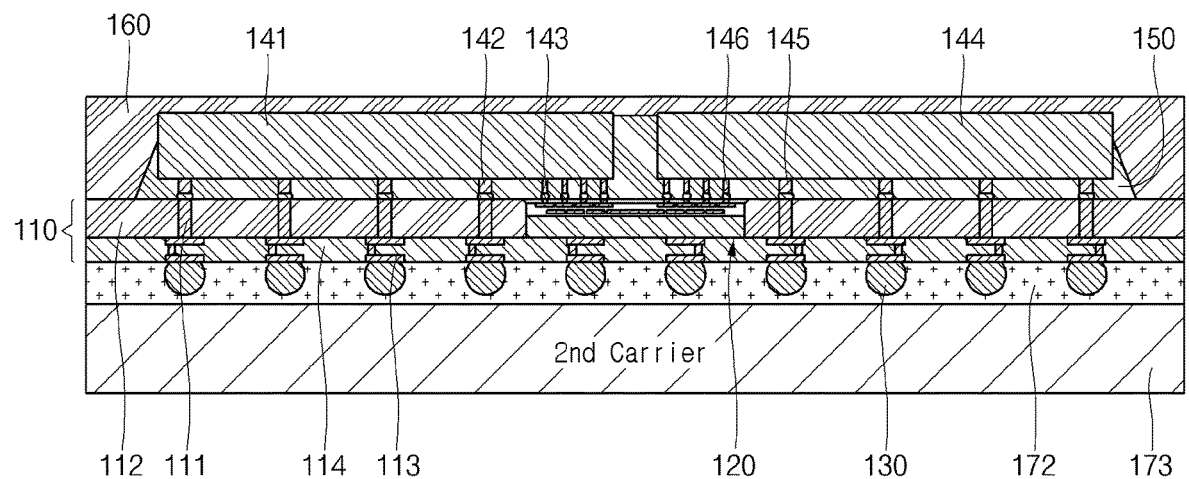

As illustrated in FIG. 2J, the first and second semiconductor dies 141 and 144 can be encapsulated by an encapsulant 160. The encapsulant 160 can cover side and top surfaces of the first and second semiconductor dies 141 and 144 disposed on the low-density substrate 110. In some embodiments, the encapsulant 160 can cover only the side surfaces of the first and second semiconductor dies 141 and 144, thereby allowing the top surfaces of the first and second semiconductor dies 141 and 144 to be exposed to the outside. When inorganic fillers of the encapsulant 160 are smaller than gap sizes between the first and second semiconductor dies 141 and 144 and the low-density substrate 110, the encapsulant 160 can directly fill gaps between the first and second semiconductor dies 141 and 144 and the low-density substrate 110 without using the underfill 150.

After completing the manufacturing process, the second carrier 173 and the temporary adhesive 172 can be removed to expose the conductive bumps 130 attached to the low-density substrate 110 to the outside. In addition, since the manufacturing process can form several semiconductor devices 100 horizontally and/or vertically arrayed, sawing or singulation into respective semiconductor devices 100 can follow at the end of the manufacturing process. To this end, the low-density substrate 110 and the encapsulant 160 can be sawed or singulated using a diamond blade or laser beams resulting in side surfaces of the low-density substrate 110 being coplanar with side surfaces of the encapsulant 160.

The present disclosure includes reference to certain example embodiments, however, it will be understood by those skilled in the art that various changes can be made and equivalents can be substituted without departing from the scope of the disclosure. In addition, modifications can be made to the disclosed example embodiments without departing from the scope of the present disclosure. Therefore, it is intended that the present disclosure not be limited to the example embodiments disclosed.

What is claimed is:

1. A semiconductor device comprising:
   a low-density substrate comprising:
      a first dielectric material;
      a plurality of low-density conductive vias extending generally vertically through the first dielectric material; and
      a cavity in the first dielectric material and positioned directly horizontally between at least two of said plurality of low-density conductive vias;
   a high-density patch positioned inside the cavity in the first dielectric material, wherein the first dielectric material comprises a molded material that contacts and laterally surrounds the high-density patch, the molded material extending directly horizontally from a lateral side of the high-density patch as least as far as a lateral side of the low-density substrate;
a first semiconductor die comprising high-density bumps and low-density bumps; and
a second semiconductor die comprising high-density bumps and low-density bumps,
wherein:
the high-density bumps of the first semiconductor die and the high-density bumps of the second semiconductor die are electrically connected to the high-density patch;
the low-density bumps of the first semiconductor die and the low-density bumps of the second semiconductor die are electrically connected to the low-density substrate;
the high-density patch comprises a first side facing toward the first and second semiconductor dies, and a second side opposite the first side; and
the first dielectric material laterally surrounds the second side of the high-density patch.

2. The semiconductor device of claim 1, further comprising an epoxy material on the high-density patch, where:
the combined vertical thicknesses of the epoxy material and the high-density patch are substantially the same as a vertical thickness of the first dielectric material; and
at least a portion of a lateral side of the high-density patch is free of the epoxy material.

3. The semiconductor device of claim 2, wherein the epoxy material comprises an underfill material comprising an uppermost surface that faces away from the high-density patch and is coplanar with an upper side of the first dielectric material.

4. The semiconductor device of claim 3, wherein the underfill material is positioned between the high-density patch and the low-density substrate.

5. The semiconductor device of claim 1, wherein the molded material comprises a grinded or etched surface.

6. The semiconductor device of claim 1, wherein the molded material is molded around the high-density patch to contact and conform to lateral sides of the high-density patch.

7. The semiconductor device of claim 1, wherein the molded material laterally spans an entirety of the semiconductor device.

8. The semiconductor device of claim 1, comprising an underfill material vertically between the first semiconductor die and the low-density substrate, vertically between the second semiconductor die and the low-density substrate, and directly laterally between the first semiconductor die and the second semiconductor die.

9. The semiconductor device of claim 8, further comprising an encapsulant covering a top side of the underfill material and laterally surrounding the underfill material.

10. The semiconductor device of claim 1, wherein the high-density patch comprises:
a base material; and
a redistribution structure on the base material.

11. The semiconductor device of claim 10, wherein the base material comprises silicon or glass.

12. A semiconductor device comprising:
a low-density substrate comprising:
a first dielectric material;
a plurality of low-density conductive vias extending generally vertically through the first dielectric material; and
a cavity in the first dielectric material, where the cavity extends completely through the first dielectric material;
a high-density patch positioned entirely inside the cavity in the first dielectric material;
a first semiconductor die comprising high-density bumps and low-density bumps; and
a second semiconductor die comprising high-density bumps and low-density bumps,
wherein:
the high-density bumps of the first semiconductor die and the high-density bumps of the second semiconductor die are electrically connected to the high-density patch;
the low-density bumps of the first semiconductor die and the low-density bumps of the second semiconductor die are electrically connected to the low-density substrate; and
each of the low-density conductive vias comprises a single pillar of a metal that vertically spans an entirety of the high-density patch.

13. The semiconductor device of claim 12, wherein the first dielectric material comprises a molded material that contacts a lateral side of the high-density patch and extends to a lateral side of the low-density substrate.

14. The semiconductor device of claim 12, wherein the first dielectric material comprises a molded material that is molded around the high-density patch to contact and conform to lateral sides of the high-density patch, and the molded material laterally spans an entirety of the package.

15. A semiconductor device comprising:
a low-density substrate comprising:
a first dielectric material;
a plurality of low-density conductive vias extending generally vertically through the first dielectric material; and
a cavity in the first dielectric material, where the cavity extends completely through the first dielectric material;
a high-density patch positioned entirely inside the cavity in the first dielectric material;
a first semiconductor die comprising high-density bumps and low-density bumps;
a second semiconductor die comprising high-density bumps and low-density bumps; and
an epoxy material on a vertically-facing side of the high-density patch and laterally surrounded by the first dielectric material,
wherein the high-density bumps of the first semiconductor die and the high-density bumps of the second semiconductor die are electrically connected to the high-density patch, and the low-density bumps of the first semiconductor die and the low-density bumps of the second semiconductor die are electrically connected to the low-density substrate.

16. The semiconductor device of claim 15, further comprising an epoxy material on the high-density patch, where:
the combined vertical thicknesses of the epoxy material and the high-density patch are substantially the same as a vertical thickness of the first dielectric material; and
at least a portion of a lateral side of the high-density patch is free of the epoxy material.

17. The semiconductor device of claim 12, wherein the high-density patch comprises:
a base material; and
a redistribution structure on the base material.

18. A method of manufacturing a semiconductor device, the method comprising:
- providing a first structure comprising:
  - a low-density substrate comprising:
    - a first dielectric material;
    - a plurality of low-density conductive vias extending generally vertically through the first dielectric material; and
    - a cavity in the first dielectric material and positioned directly horizontally between at least two of said plurality of low-density conductive vias; and
  - a high-density patch positioned inside the cavity in the first dielectric material, wherein the first dielectric material comprises a molded material that contacts and laterally surrounds the high-density patch, the molded material extending directly horizontally from a lateral side of the high-density patch to a lateral side of the low-density substrate;
- providing a first semiconductor die comprising high-density bumps and low-density bumps;
- providing a second semiconductor die comprising high-density bumps and low-density bumps;
- electrically connecting the high-density bumps of the first semiconductor die and the high-density bumps of the second semiconductor die to the high-density patch; and
- electrically connecting the low-density bumps of the first semiconductor die and the low-density bumps of the second semiconductor die to the low-density substrate.

19. A method of manufacturing a semiconductor device, the method comprising:
- providing a first structure comprising:
  - a low-density substrate comprising:
    - a first dielectric material;
    - a plurality of low-density conductive vias extending generally vertically through the first dielectric material; and
    - a cavity in the first dielectric material; and
  - a high-density patch positioned inside the cavity in the first dielectric material, wherein the first dielectric material contacts and laterally surrounds the high-density patch;
- providing a first semiconductor die comprising high-density bumps and low-density bumps;
- providing a second semiconductor die comprising high-density bumps and low-density bumps;
- electrically connecting the high-density bumps of the first semiconductor die and the high-density bumps of the second semiconductor die to the high-density patch; and
- electrically connecting the low-density bumps of the first semiconductor die and the low-density bumps of the second semiconductor die to the low-density substrate,
- wherein the first structure comprises an epoxy material on the high-density patch, where:
  - the combined vertical thicknesses of the epoxy material and the high-density patch are substantially the same as a vertical thickness of the first dielectric material; and
  - at least a portion of a lateral side of the high-density patch is free of the epoxy material.

20. The method of claim 18, wherein the first dielectric material comprises a molded material that is molded around the high-density patch to contact and conform to lateral sides of the high-density patch.

21. The method of claim 18, wherein:
- the high-density patch comprises a first side facing the first and second semiconductor dies, and a second side opposite the first side; and
- the first dielectric material laterally surrounds the second side of the high-density patch.

22. The semiconductor device of claim 12, wherein:
- the cavity in the first dielectric material is positioned directly horizontally between at least two of said plurality of low-density conductive vias.

* * * * *